US012027454B1

(12) United States Patent
Rho et al.

(10) Patent No.: US 12,027,454 B1
(45) Date of Patent: Jul. 2, 2024

(54) PACKAGING SUBSTRATE HAVING ELECTRIC POWER TRANSMITTING ELEMENTS ON NON-CIRCULAR CORE VIA OF CORE VIAS AND SEMICONDUCTOR DEVICE COMPRISING THE SAME

(71) Applicant: ABSOLICS INC., Covington, GA (US)

(72) Inventors: Youngho Rho, Daejeon (KR); Sungjin Kim, Suwanee, GA (US); Jincheol Kim, Hwaseong-si (KR)

(73) Assignee: Absolics Inc., Covington, GA (US)

( * ) Notice: Subject to any disclaimer, the term of this patent is extended or adjusted under 35 U.S.C. 154(b) by 0 days.

(21) Appl. No.: 18/324,031

(22) Filed: May 25, 2023

Related U.S. Application Data

(60) Continuation of application No. 17/866,623, filed on Jul. 18, 2022, now Pat. No. 11,728,259, which is a
(Continued)

(51) Int. Cl.
*H01L 23/498* (2006.01)
*H01L 21/48* (2006.01)
(Continued)

(52) U.S. Cl.
CPC ...... *H01L 23/49827* (2013.01); *H01L 21/486* (2013.01); *H01L 21/76871* (2013.01); *H01L 23/15* (2013.01); *H01L 23/49838* (2013.01); *H01L 23/49866* (2013.01); *H01L 25/18* (2013.01); *H10B 80/00* (2023.02); *H01L 21/30604* (2013.01)

(58) Field of Classification Search
CPC ............. H01L 23/49827; H01L 21/486; H01L 23/49838
See application file for complete search history.

(56) References Cited

U.S. PATENT DOCUMENTS

| 4,835,598 A | 5/1989 | Higuchi et al. |
| 5,304,743 A | 4/1994 | Sen et al. |

(Continued)

FOREIGN PATENT DOCUMENTS

| CN | 1317163 A | 10/2001 |
| CN | 1614464 A | 5/2005 |

(Continued)

OTHER PUBLICATIONS

International Search Report dated Jul. 29, 2020 in counterpart International Patent Application No. PCT/KR2020/004898 (2 pages in English and 2 pages in Korean).
(Continued)

*Primary Examiner* — Michael Jung
(74) *Attorney, Agent, or Firm* — NSIP Law

(57) ABSTRACT

A packaging substrate includes a core layer including a glass substrate with a first surface and a second surface facing each other, and a plurality of core vias. The plurality of core vias penetrating through the glass substrate in a thickness direction, each comprising a circular core via having a circular opening part and a non-circular core via having an aspect ratio of 2 to 25 in the x-y direction of an opening part. One or more electric power transmitting elements are disposed on the non-circular core via.

10 Claims, 13 Drawing Sheets

Related U.S. Application Data division of application No. 17/460,966, filed on Aug. 30, 2021, now Pat. No. 11,469,167, which is a continuation of application No. PCT/KR2020/004898, filed on Apr. 10, 2020.

(60) Provisional application No. 62/890,689, filed on Aug. 23, 2019.

(51) Int. Cl.
*H01L 21/768* (2006.01)
*H01L 23/15* (2006.01)
*H01L 25/18* (2023.01)
*H10B 80/00* (2023.01)
*H01L 21/306* (2006.01)

(56) References Cited

U.S. PATENT DOCUMENTS

| | | |
|---|---|---|
| 5,414,222 A | 5/1995 | Sen et al. |
| 6,610,934 B2 | 8/2003 | Yamaguchi et al. |
| 8,774,580 B2 | 7/2014 | Bolle |
| 9,167,694 B2 | 10/2015 | Sundaram et al. |
| 9,263,370 B2 | 2/2016 | Shenoy et al. |
| 9,420,708 B2 | 8/2016 | Hibino et al. |
| 9,768,090 B2 | 9/2017 | Liang et al. |
| 10,483,210 B2 | 11/2019 | Gross et al. |
| 2002/0093120 A1 | 7/2002 | Magni et al. |
| 2006/0179341 A1 | 8/2006 | Harrod |
| 2006/0182556 A1 | 8/2006 | Liu et al. |
| 2006/0202322 A1 | 9/2006 | Kariya et al. |
| 2006/0226094 A1 | 10/2006 | Cho et al. |
| 2008/0017407 A1 | 1/2008 | Kawano |
| 2008/0217761 A1 | 9/2008 | Yang et al. |
| 2009/0117336 A1 | 5/2009 | Usui et al. |
| 2010/0224524 A1 | 9/2010 | Yuasa et al. |
| 2012/0106117 A1 | 5/2012 | Sundaram et al. |
| 2012/0139118 A1 | 6/2012 | Kim |
| 2012/0153463 A1 | 6/2012 | Maeda |
| 2012/0186866 A1 | 7/2012 | Mikado et al. |
| 2013/0050227 A1 | 2/2013 | Petersen et al. |
| 2013/0069251 A1 | 3/2013 | Kunimoto et al. |
| 2013/0293482 A1 | 11/2013 | Burns et al. |
| 2014/0034374 A1 | 2/2014 | Cornejo et al. |
| 2014/0116763 A1 | 5/2014 | Sato et al. |
| 2014/0116767 A1 | 5/2014 | Sato et al. |
| 2014/0326686 A1 | 11/2014 | Li et al. |
| 2015/0027757 A1 | 1/2015 | Shin et al. |
| 2015/0062851 A1 | 3/2015 | Shimizu et al. |
| 2015/0179560 A1* | 6/2015 | Arisaka ............ H01L 23/49827 257/777 |
| 2015/0235915 A1 | 8/2015 | Liang et al. |
| 2015/0235936 A1 | 8/2015 | Yu et al. |
| 2015/0235989 A1 | 8/2015 | Yu et al. |
| 2015/0245486 A1 | 8/2015 | Shin et al. |
| 2016/0111380 A1 | 4/2016 | Sundaram et al. |
| 2016/0286660 A1 | 9/2016 | Gambino et al. |
| 2016/0300740 A1 | 10/2016 | Xu |
| 2017/0040265 A1 | 2/2017 | Park et al. |
| 2017/0064835 A1 | 3/2017 | Ishihara et al. |
| 2017/0144844 A1 | 5/2017 | Dong |
| 2017/0186710 A1 | 6/2017 | Yoon et al. |
| 2017/0223825 A1 | 8/2017 | Thadesar et al. |
| 2017/0363580 A1 | 12/2017 | Ahmad et al. |
| 2018/0068868 A1 | 3/2018 | Jaramillo et al. |
| 2018/0240778 A1 | 8/2018 | Liu et al. |
| 2018/0342450 A1 | 11/2018 | Huang et al. |
| 2018/0342451 A1 | 11/2018 | Dahlberg et al. |
| 2023/0062692 A1 | 3/2023 | Park |

FOREIGN PATENT DOCUMENTS

| | | |
|---|---|---|
| CN | 101039549 A | 9/2007 |
| CN | 101189921 A | 5/2008 |
| CN | 101415626 A | 4/2009 |
| CN | 102097330 A | 6/2011 |
| CN | 102106198 A | 6/2011 |
| CN | 102122691 A | 7/2011 |
| CN | 102246299 A | 11/2011 |
| CN | 102844857 A | 12/2012 |
| CN | 103188866 A | 7/2013 |
| CN | 103208480 A | 7/2013 |
| CN | 106029286 A | 10/2016 |
| CN | 106449574 A | 2/2017 |
| CN | 107112297 A | 8/2017 |
| CN | 107683524 A | 2/2018 |
| CN | 107758041 A | 3/2018 |
| CN | 107848878 A | 3/2018 |
| CN | 108878343 A | 11/2018 |
| CN | 109411432 A | 3/2019 |
| EP | 0 526 456 B1 | 8/1998 |
| JP | 2000-142876 A | 5/2000 |
| JP | 2001-7531 A | 1/2001 |
| JP | 3173250 B2 | 3/2001 |
| JP | 2004-311919 A | 11/2004 |
| JP | 2005-235497 A | 9/2005 |
| JP | 2007-80720 A | 3/2007 |
| JP | 2007-227967 A | 9/2007 |
| JP | 2007-281252 A | 10/2007 |
| JP | 3998984 B2 | 10/2007 |
| JP | 4012375 B2 | 11/2007 |
| JP | 2009-295862 A | 12/2009 |
| JP | 2010-80679 A | 4/2010 |
| JP | 2011-228495 A | 11/2011 |
| JP | 2013-38374 A | 2/2013 |
| JP | 2013-537723 A | 10/2013 |
| JP | 2014-45026 A | 3/2014 |
| JP | 2014-72205 A | 4/2014 |
| JP | 2014-127701 A | 7/2014 |
| JP | 2014-139963 A | 7/2014 |
| JP | 2014-236029 A | 12/2014 |
| JP | 2015-18675 A | 1/2015 |
| JP | 2015-80800 A | 4/2015 |
| JP | 2015-95590 A | 5/2015 |
| JP | 2016-18831 A | 2/2016 |
| JP | 2016-111221 A | 6/2016 |
| JP | 2016-136615 A | 7/2016 |
| JP | 2016-213466 A | 12/2016 |
| JP | 2016-225620 A | 12/2016 |
| JP | 2017-5174 A | 1/2017 |
| JP | 2017-41645 A | 2/2017 |
| JP | 2017-50315 A | 3/2017 |
| JP | 6110437 B2 | 4/2017 |
| JP | 2017-112209 A | 6/2017 |
| JP | 2017-121648 A | 7/2017 |
| JP | 2017-216398 A | 12/2017 |
| JP | 6273873 B2 | 2/2018 |
| JP | 2018-116951 A | 7/2018 |
| JP | 2018-120902 A | 8/2018 |
| JP | 2018-163901 A | 10/2018 |
| JP | 2018-199605 A | 12/2018 |
| JP | 2019-16672 A | 1/2019 |
| KR | 10-1997-0050005 A | 7/1997 |
| KR | 10-0184043 B1 | 5/1999 |
| KR | 10-2001-0107033 A | 12/2001 |
| KR | 10-2002-0008574 A | 1/2002 |
| KR | 20-0266536 Y1 | 2/2002 |
| KR | 10-0447323 B1 | 9/2004 |
| KR | 10-0538733 B1 | 12/2005 |
| KR | 10-0687557 B1 | 2/2007 |
| KR | 10-0720090 B1 | 5/2007 |
| KR | 10-2007-0085553 A | 8/2007 |
| KR | 10-0794961 B1 | 1/2008 |
| KR | 10-0859206 B1 | 9/2008 |
| KR | 10-0870685 B1 | 11/2008 |
| KR | 10-2010-0044450 A | 4/2010 |
| KR | 10-2010-0097383 A | 9/2010 |
| KR | 10-2011-0112974 A | 10/2011 |
| KR | 10-2012-0023120 A | 3/2012 |
| KR | 10-2012-0051992 A | 5/2012 |
| KR | 10-1160120 B1 | 6/2012 |
| KR | 10-2013-0038825 A | 4/2013 |
| KR | 10-2014-0044746 A | 4/2014 |

(56) References Cited

FOREIGN PATENT DOCUMENTS

| | | |
|---|---|---|
| KR | 10-1466582 B1 | 11/2014 |
| KR | 10-1468680 B1 | 12/2014 |
| KR | 10-1486366 B1 | 1/2015 |
| KR | 10-2015-0014167 A | 2/2015 |
| KR | 10-1531097 B1 | 6/2015 |
| KR | 10-2015-0145697 A | 12/2015 |
| KR | 10-2016-0048868 A | 5/2016 |
| KR | 10-2016-0094502 A | 8/2016 |
| KR | 10-2016-0114710 A | 10/2016 |
| KR | 10-2016-0124323 A | 10/2016 |
| KR | 10-2016-0141516 A | 12/2016 |
| KR | 10-2017-0084562 A | 7/2017 |
| KR | 10-1760846 B1 | 7/2017 |
| KR | 10-2017-0126394 A | 11/2017 |
| KR | 10-1825149 B1 | 2/2018 |
| KR | 10-1825276 B1 | 2/2018 |
| KR | 10-2018-0040498 A | 4/2018 |
| KR | 10-2018-0067568 A | 6/2018 |
| KR | 10-2018-0088599 A | 8/2018 |
| KR | 10-2018-0116733 A | 10/2018 |
| KR | 10-1903485 B1 | 10/2018 |
| KR | 10-2019-0002622 A | 1/2019 |
| KR | 10-2019-0008103 A | 1/2019 |
| KR | 10-1944718 B1 | 2/2019 |
| KR | 10-2019-0026676 A | 3/2019 |
| TW | 201929100 A | 7/2019 |
| WO | WO 2004/053983 A1 | 6/2004 |
| WO | WO 2006/050205 A2 | 5/2006 |
| WO | WO 2018/013054 A1 | 1/2008 |
| WO | WO 2008/105496 A1 | 9/2008 |
| WO | WO 2012/061304 A1 | 5/2012 |
| WO | WO 2015/198912 A1 | 12/2015 |
| WO | WO 2016/052221 A1 | 4/2016 |
| WO | WO 2017/057645 A1 | 4/2017 |
| WO | WO 2017/188281 A1 | 11/2017 |

OTHER PUBLICATIONS

Written Opinion dated Jul. 29, 2020 in counterpart International Patent Application No. PCT/KR2020/004898 (3 pages in English and 3 pages in Korean).

* cited by examiner (a)

(b)

(a)

(b)

PACKAGING SUBSTRATE HAVING ELECTRIC POWER TRANSMITTING ELEMENTS ON NON-CIRCULAR CORE VIA OF CORE VIAS AND SEMICONDUCTOR DEVICE COMPRISING THE SAME

CROSS-REFERENCE TO RELATED APPLICATIONS

Pursuant to 35 USC 120 and 365(c), this application is a continuation of U.S. patent application Ser. No. 17/866,623, filed on Jul. 18, 2022, which is a division of U.S. patent application Ser. No. 17/460,966, filed on Aug. 30, 2021, which is a continuation of International Application No. PCT/KR2020/004898 filed on Apr. 10, 2020, which claims the benefit of U.S. Provisional Patent Application No. 62/890,689, filed on Aug. 23, 2019, the entire disclosures of which are incorporated herein by reference for all purposes.

BACKGROUND

1. Field

The following description relates to a packaging substrate and semiconductor device comprising the same.

2. Description of Related Art

In the manufacturing of electronic components, implementing a circuit on a semiconductor wafer is referred to as a Front-End Process (FE), and the assembly of a wafer such that it can be actually used in a product is referred to as a Back-End Process (BE). The Back-End process includes a packaging process.

Four key technologies of the semiconductor industry that enable the rapid development of electronic products in recent years include semiconductor technology, semiconductor packaging technology, manufacturing process technology, and software technology. Semiconductor technology has been developed in various forms such as line width of a nanometer unit, which is smaller than a micrometer unit, 10 million or more cells, high-speed operation, and much heat dissipation, but the technology of complete packaging is not being supported. Thus, it is considered that the electrical performance of packaged semiconductors may be determined by the packaging technology and the resulting electrical connection rather than the performance of the semiconductor itself.

Ceramic or resin is used as the material of a packaging substrate. In the case of a ceramic substrate such as Si substrate, it is not easy to mount a high-performance and high-frequency semiconductor element thereon due to high resistance or high dielectric constant. In the case of a resin substrate, it is possible to mount a high-performance and high-frequency semiconductor element thereon, but there is a distinct limitation to the reduction of pitches of conductive lines.

Recently, research is being conducted to apply silicon or glass to a high-end packaging substrate. By forming a through-via on a silicon or glass substrate and applying a conductive material into the through-via, it is possible to shorten the length of conductive lines between an element and a motherboard and have excellent electric characteristics.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a packaging substrate includes a core layer including a glass substrate with a first surface and a second surface facing each other, and a plurality of core vias. The plurality of core vias penetrating through the glass substrate in a thickness direction, each comprising a circular core via having a circular opening part and a non-circular core via having a 1.2 or more aspect ratio in the x-y direction of an opening part. One or more electric power transmitting elements are disposed on the non-circular core via.

The packaging substrate further may include an electrically conductive layer with a minimum thickness of 5 µm or more being disposed inside the non-circular core via.

The packaging substrate may further include an electrically conductive layer occupying 30% or more of an inner volume of the non-circular core via being disposed inside the non-circular core via.

A contour of the opening part of the non-circular core via may be any one of an oval shape, a quadrangle shape, a L shape, or a U shape.

The packaging substrate may further include a non-circular via distribution pattern, disposed inside the non-circular core via, include any one or both of a filled-via pattern where all of an inner space of the non-circular core via is filled with an electrically conductive layer, and a composite-via pattern where some of the inner space of the non-circular core via is filled with the electrically conductive layer and the remainder is filled with an insulating layer.

The filled-via pattern may include any one or both of a filled-via pattern I where all the inner space of the non-circular core via is filled with the electrically conductive layer, and a filled-via pattern II where the non-circular core via comprises conformal-via pattern and all the inner space of the non-circular core via is filled with the electrically conductive layer.

The composite-via pattern may include any one or both of a composite-via pattern I where the electrically conductive layer is formed to substantially meet an inner diameter surface of the non-circular core via and the remainder inside the non-circular core via is filled with an insulating layer, and a composite-via pattern II where an insulating layer is formed to substantially meet the inner diameter surface of the non-circular core via and the electrically conductive layer is formed in a space other than the insulating layer.

The electrically conductive layer of the non-circular via distribution pattern and an electrode of the electric power transmitting element may be connected.

Each of the core vias may include a first opening part in contact with the first surface, a second opening part in contact with the second surface, and a minimum inner diameter part having a smallest inner diameter.

In another general aspect, a semiconductor device includes a semiconductor element unit, a packaging substrate, and a motherboard. The semiconductor element unit includes one or more semiconductor elements. The packaging substrate, electrically connected to the semiconductor element unit, includes a core layer comprising a glass substrate with a first surface and a second surface facing each other, and a plurality of core vias, penetrating through the glass substrate in a thickness direction, each comprising a circular core via having a circular opening part and a non-circular core via having a 1.2 or more aspect ratio in the x-y direction of an opening part. One or more electric power transmitting elements are disposed on the non-circular core via. The motherboard, electrically connected to the packaging substrate, transmitting electrical signals within and external of the semiconductor elements.

Other features and aspects will be apparent from the following detailed description, the drawings, and the claims.

BRIEF DESCRIPTION OF THE DRAWINGS

FIG. 1 (b) is a conceptual view illustrating an example of an image of electric power transmitting elements.

FIG. 2 (b) is a conceptual view illustrating a part of b-b' cross-section of the FIG. 1 (a).

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
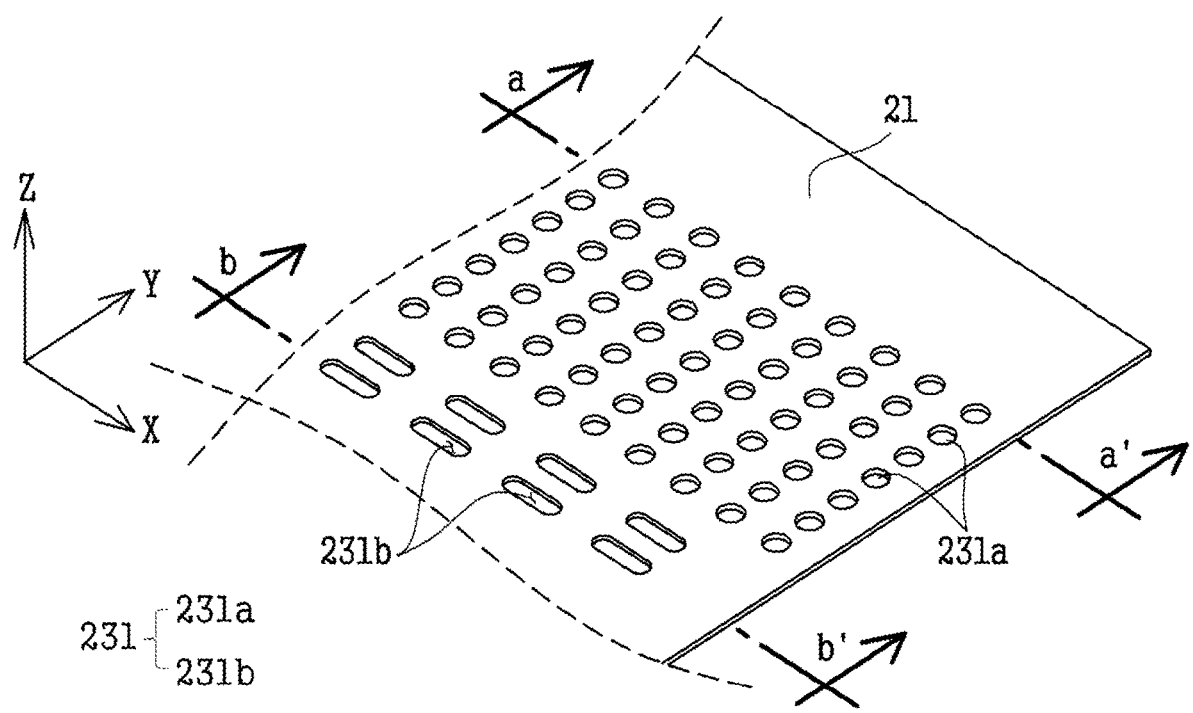
FIG. 1 (a) is a conceptual view illustrating an example of an image of core vias and non-circular vias formed.
Figure 1:
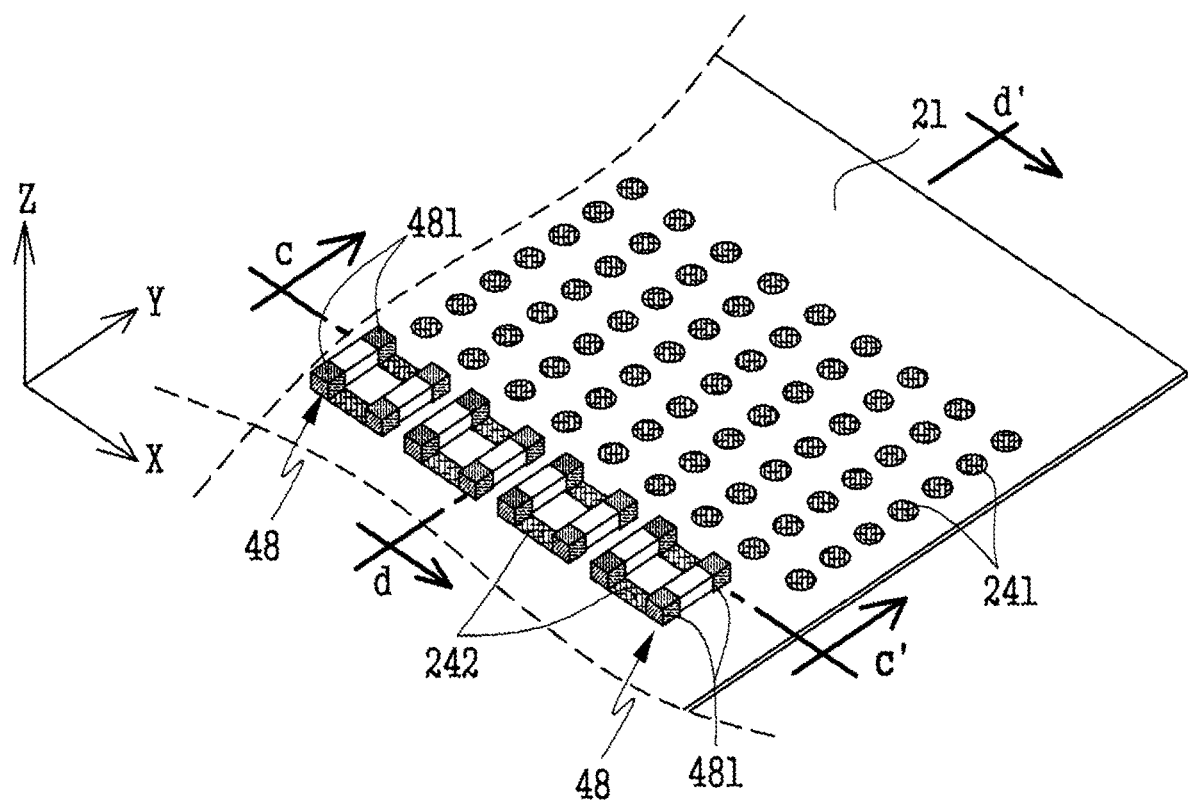
Figure 2A:
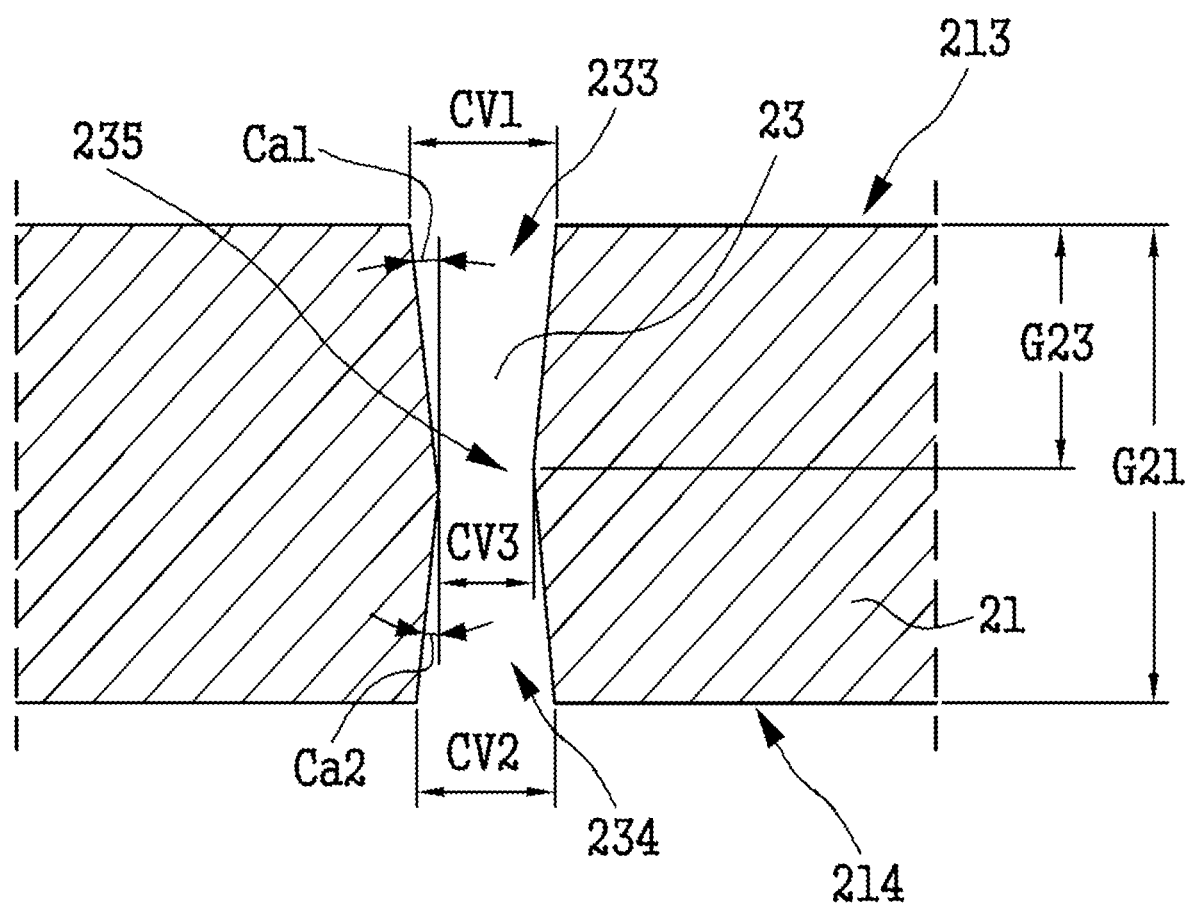
FIG. 2 (a) is a conceptual view illustrating a part of a-a' cross-section of the FIG. 1 (a).
Figure 2B:
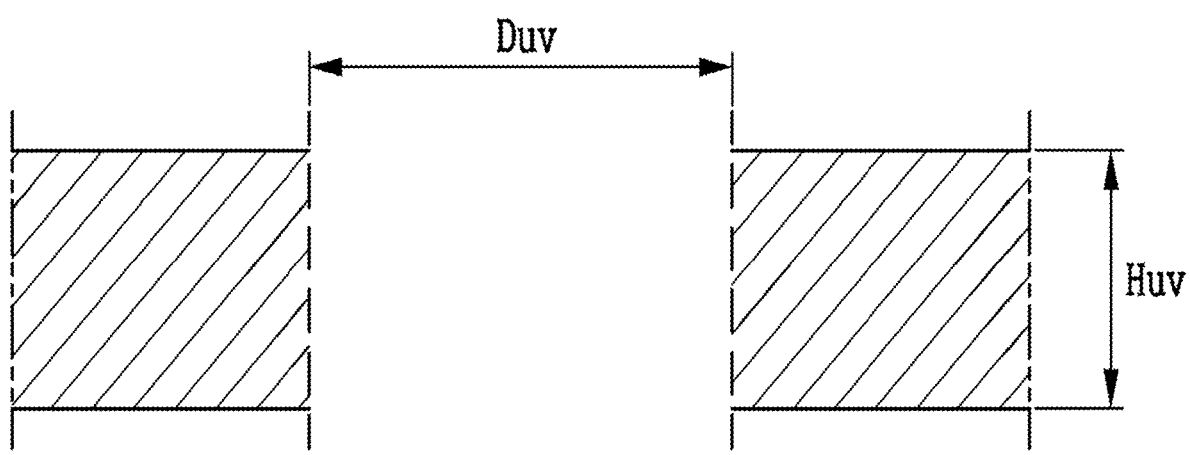
Figure 3:
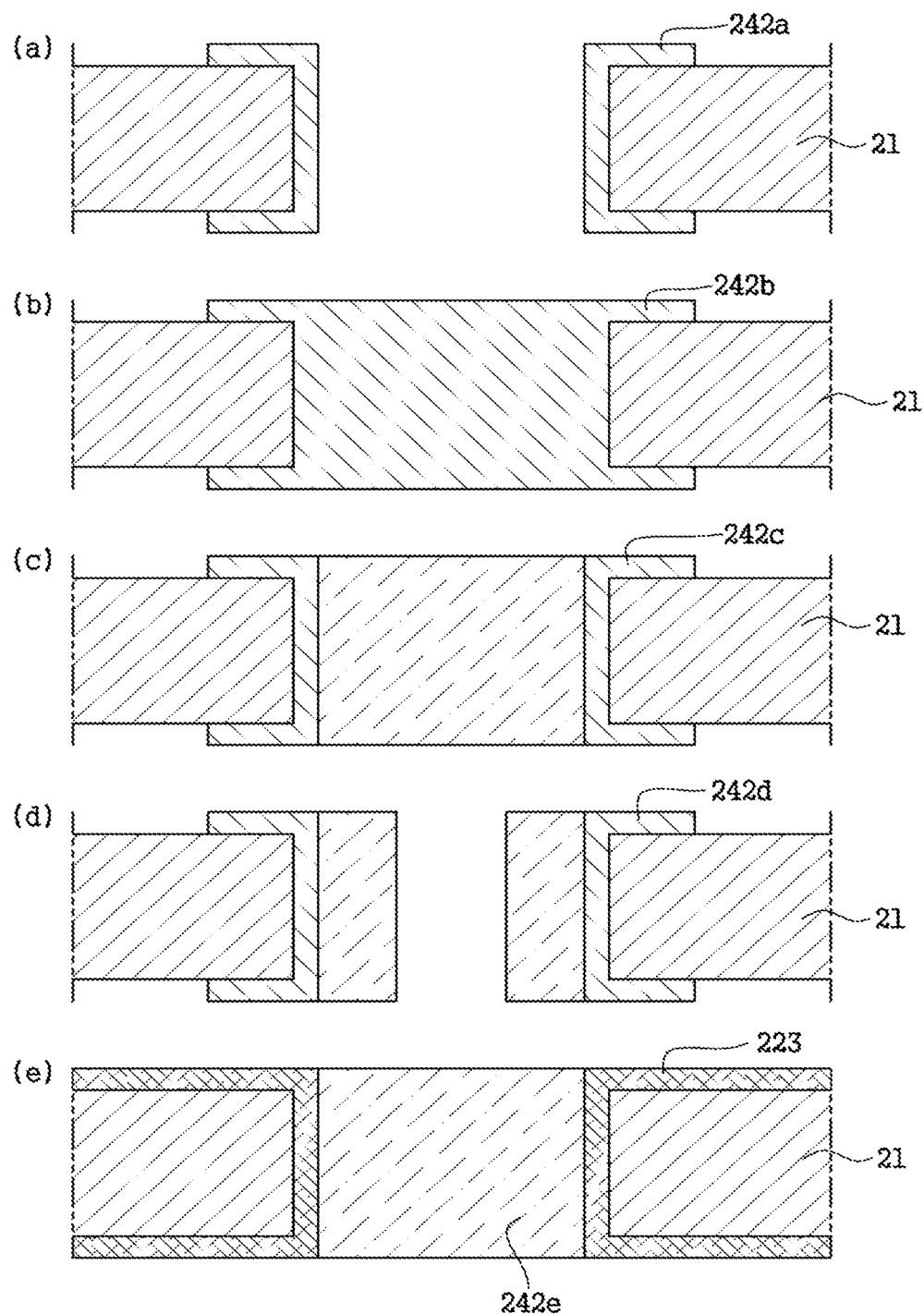
FIG. 3 depicts conceptual views (a) to (d) illustrating examples of an image of a distribution pattern formed on a non-circular via using a cross-section thereof.
Figure 4:
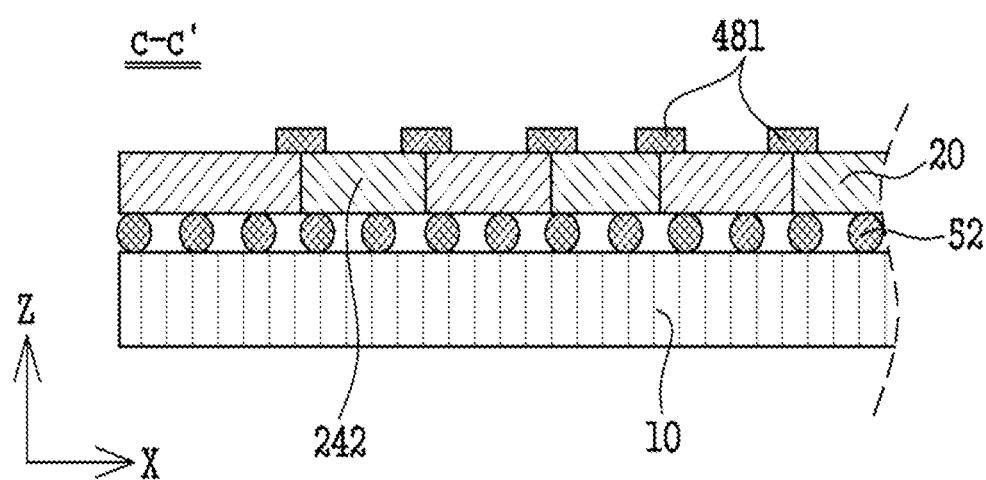
FIG. 4 depicts conceptual views (a) and (b) illustrating examples of images of electric power transmitting elements disposed on non-circular vias at a cross-section in the x-z direction and at another cross-section in the y-z direction, respectively.
Figure 4:
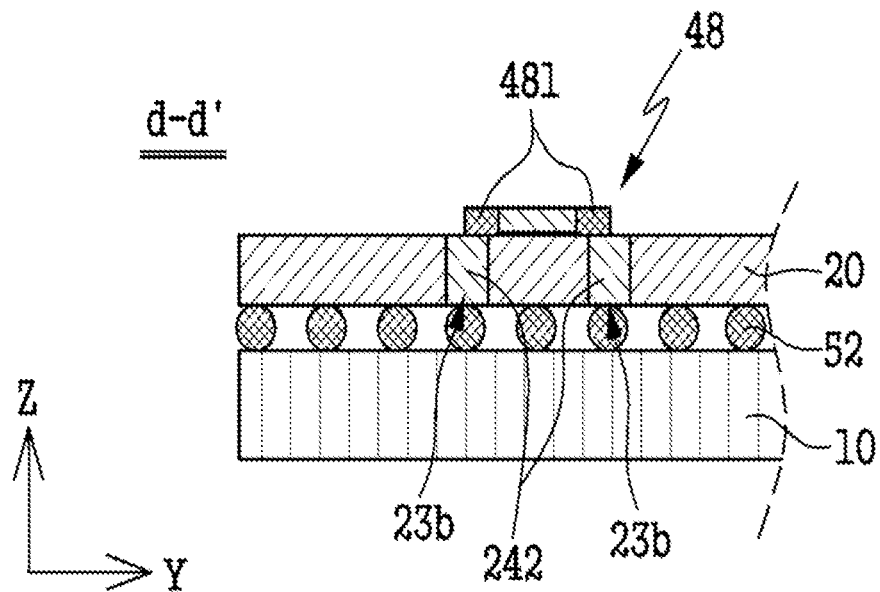
Figure 5:
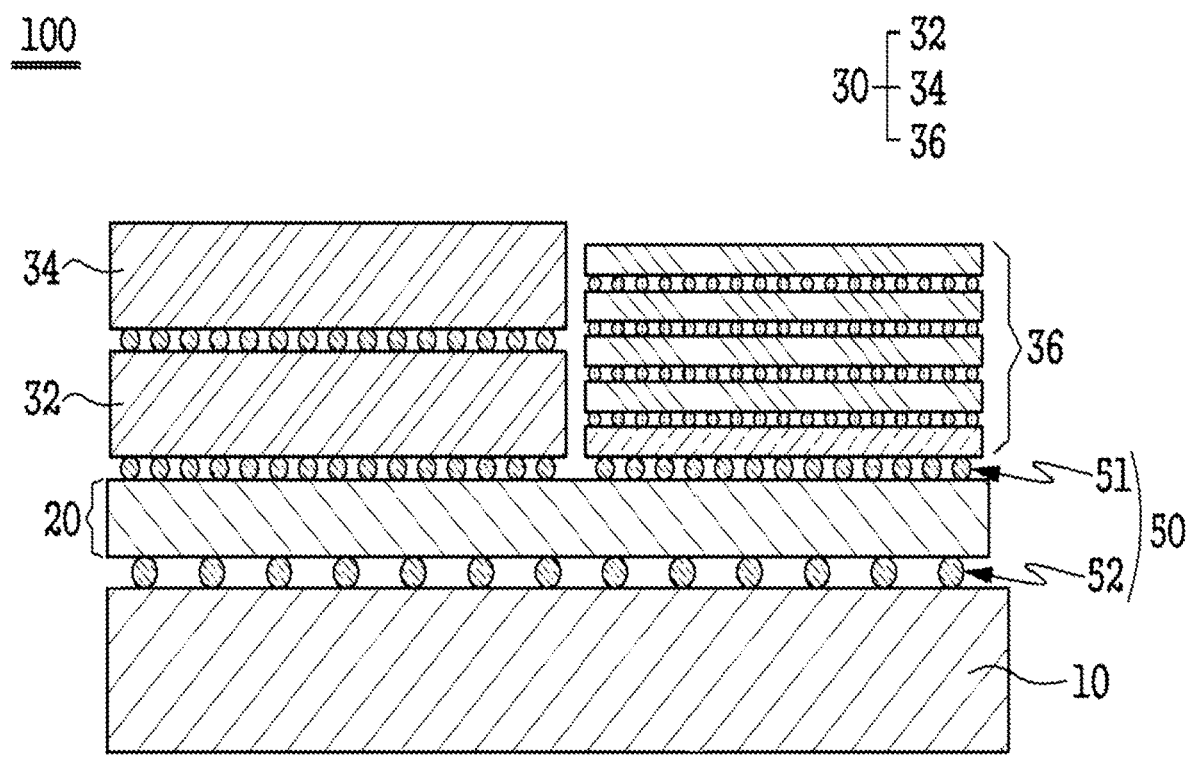
FIG. 5 is a conceptual view illustrating a cross-section of an example of a semiconductor device.
Figure 6:
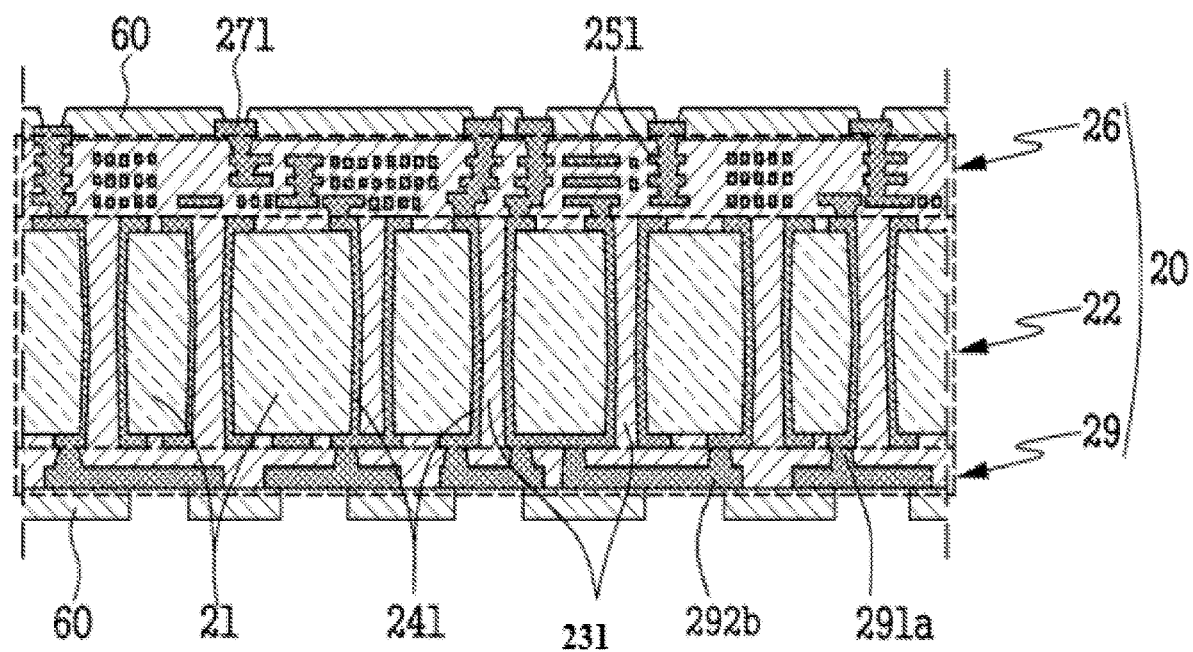
FIG. 6 is a conceptual view illustrating a cross-section of an example of a packaging substrate.
Figure 7:
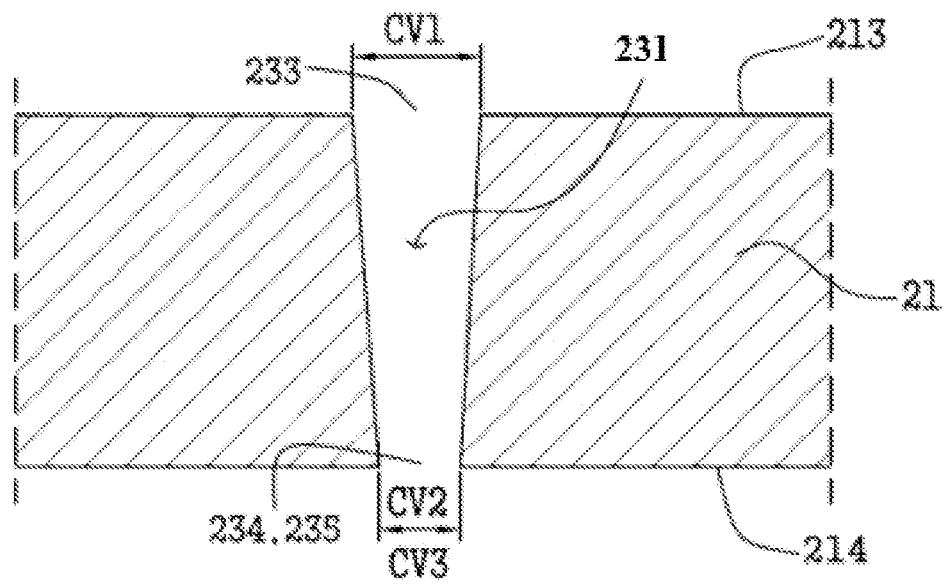
FIG. 7 depicts conceptual views (a) and (b) illustrating cross-sections of core vias applied in one or more examples.
Figure 7:
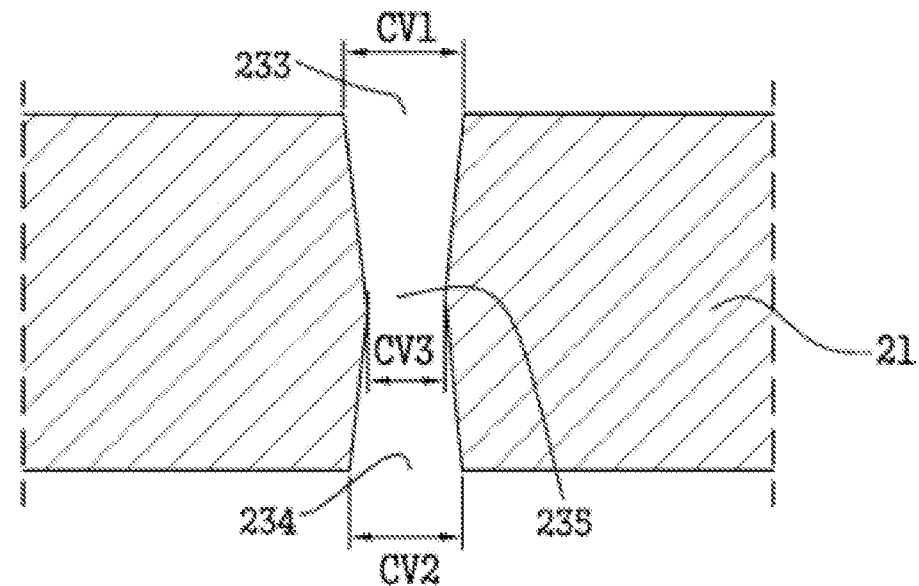
Figure 8:
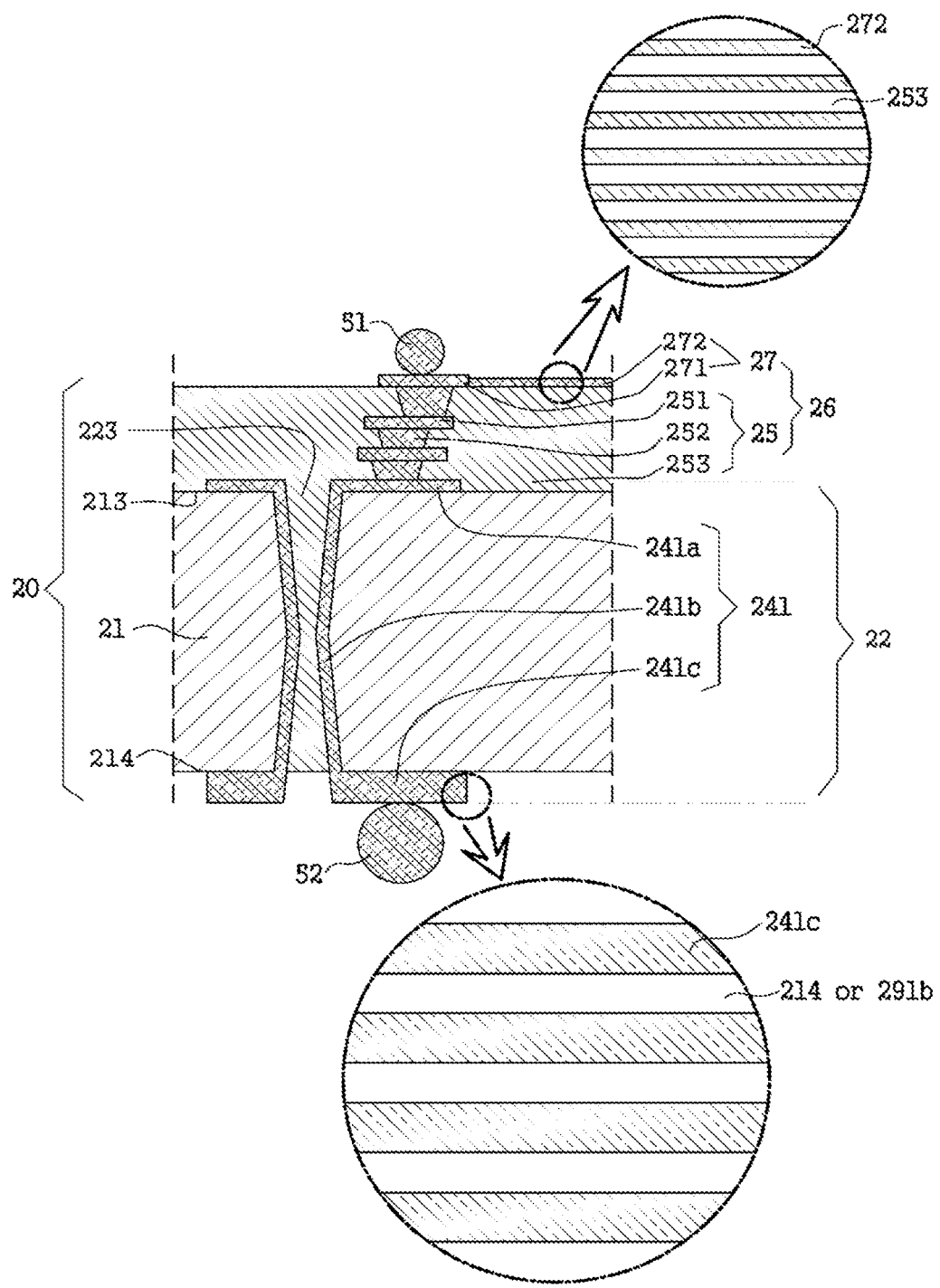
FIGS. 8 and 9 are detailed conceptual views illustrating some cross-sections of examples of a packaging substrate (a circle indicates a view obtained through observation from the top or the bottom.).
Figure 9:
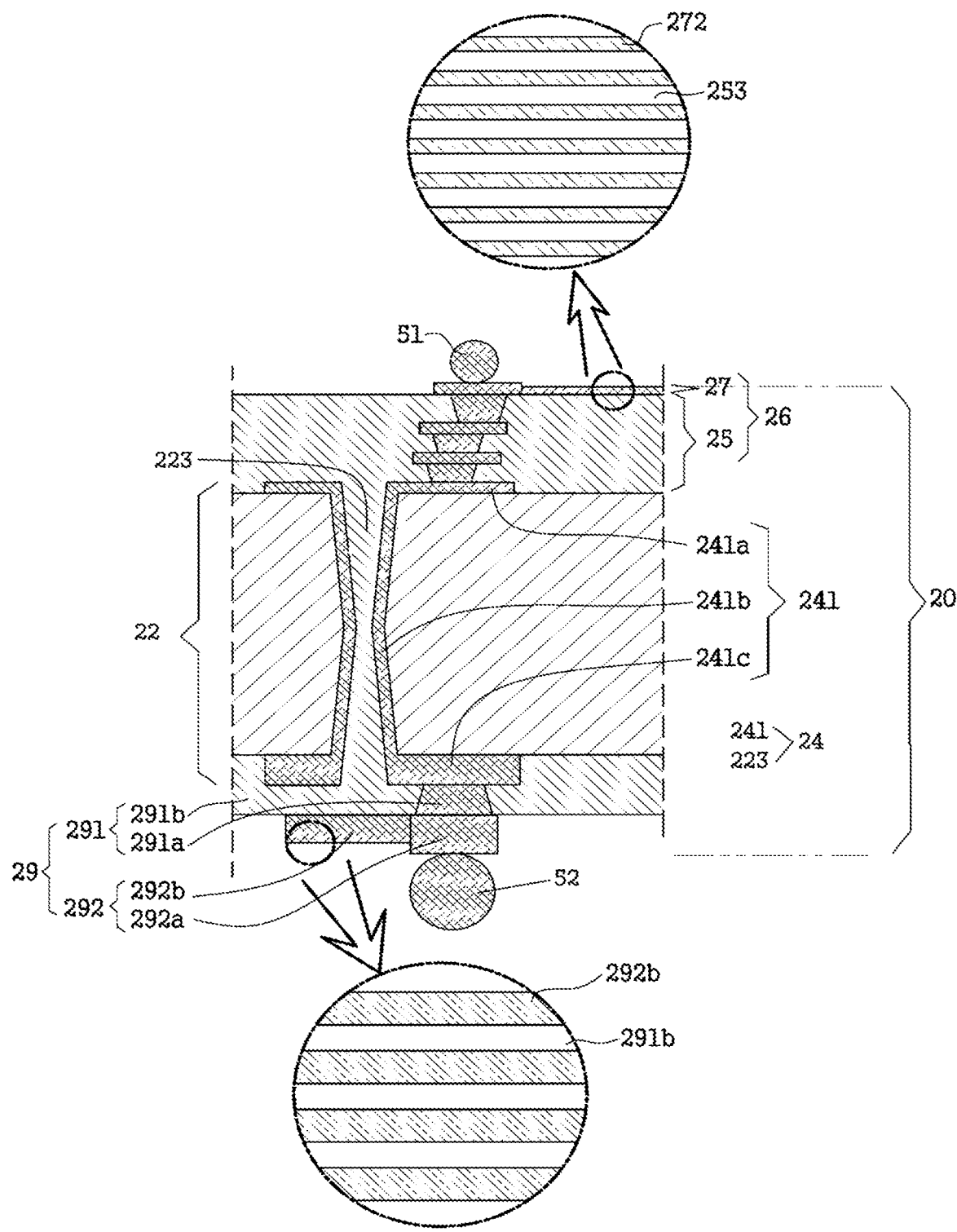

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Throughout the present specification, the phrase "combination(s) thereof" included in a Markush-type expression denotes one or more mixtures or combinations selected from the group consisting of components stated in the Markush-type expression, that is, denotes that one or more components selected from the group consisting of the components are included.

In the present specification, the term "X-based" may mean that a compound includes a compound corresponding to X or a derivative of X.

In the present specification, "B being disposed on A" means that B is disposed in direct contact with A or disposed over A with another layer interposed therebetween and thus should not be interpreted as being limited to B being disposed in direct contact with A.

The inventors of the present disclosure have recognized that, in the process of developing a semiconductor device capable of exhibiting high performance with a more integrated form and thinner thickness, not only the device itself but also the packaging process is an important factor for improving its performance. The inventors have confirmed that, by applying a glass core in a single layer and controlling the shape of a key through-via, and an electrically conductive layer formed thereon, etc., it is possible to make a packaging substrate thinner and to improve the electrical property of the semiconductor device, unlike a conventional interposer and organic substrate in which two or more layers of cores are applied on a motherboard as a packaging substrate, and thus have completed this invention. Also, the inventors of the present disclosure have recognized that in a case of an electric power transmitting element, a circular through-hole formed by using a drill in a conventional organic substrate has a limitation of efficiency of transmitting electrical signals, and in the process of conducting research to find a method for improving them, have confirmed that this problem can be solved by utilizing a non-circular via which can be formed on the glass substrate, thereby completed this invention.

Hereinafter, embodiments will be described in more detail with reference to FIGS. 1(a) to 9 below.

To achieve the above objectives, a semiconductor device 100 according to an embodiment comprises a semiconductor element unit 30 where one or more semiconductor elements 32, 34, and 36 are disposed; a packaging substrate 20 electrically connected to the semiconductor elements 32, 34, and 36; and a motherboard 10 electrically connected to the packaging substrate 20 and transmitting electrical signals of the semiconductor elements and external, and connecting each other.

The packaging substrate 20, according to another embodiment of the present disclosure, comprises a core layer 22 and an upper layer 26.

The semiconductor element unit 30 refers to elements mounted on a semiconductor device and is mounted on the packaging substrate 20 through a connecting electrode or the like. In detail, for example, a computation element such as a central processing unit (CPU) and a graphics processing unit (GPU) (a first element 32 and a second element 34), a memory element such as a memory chip (a third element 36), or the like may be applied as the semiconductor element unit 30, but any semiconductor element capable of being mounted on a semiconductor device may be applicable without limitation.

A motherboard, such as a printed circuit board and a printed wiring board, may be applied as the motherboard 10.

The packaging substrate 20 comprises a core layer 22 and an upper layer 26 disposed on one side of the core layer 22.

Optionally, the packaging substrate 20 may further comprise a lower layer 29 disposed under the core layer 22.

The core layer 22 comprises a glass substrate 21; a plurality of core vias 23, which penetrate the glass substrate 21 in a thickness direction; and a core distribution layer 24 disposed on a surface of the glass substrate 21 or a surface of the core via 231 and at least a part of which electrically connect electrically conductive layers on the first surface and the second surface through the core vias 23.

The glass substrate 21 has a first surface 213 and a second surface 214 facing each other, and the two surfaces are substantially parallel to each other and have a substantially uniform thickness throughout the glass substrate.

The glass substrate 21 has a core via 231 passing through the first surface 213 and the second surface 214. Conventionally, a silicon substrate and an organic substrate were applied while being stacked thereon, as the packaging substrate of the semiconductor device. When a silicon substrate is applied to a high-speed circuit, a parasitic element effect may occur due to the semiconductor property of the silicon substrate, and a relatively large power loss may be a result. Also, an organic substrate requires a larger area to form a more complicated distribution pattern, but this does not correspond to the miniaturization trend of electronic devices. In order to form a complicated distribution pattern within a predetermined size, it is necessary to make patterns finer substantially, but there has been a practical limit to the miniaturization of the patterns due to a material property of polymer and the like applied to the organic substrate.

In the embodiment, the glass substrate 21 is applied as a supporting body for the core layer 22 in order to solve these problems. Also, by applying the core via 231 formed to penetrate the glass substrate 21, as well as the glass substrate 21, it is possible to provide a packaging substrate 20 having a shortened electrical flow length, a smaller size, a faster response, and a lower loss property.

It is preferable to apply a glass substrate being applied to semiconductors as the glass substrate 21. For example, a borosilicate glass substrate, a non-alkali glass substrate, or the like may be applicable, but the present disclosure is not limited thereto.

The glass substrate 21 may have a thickness of 1,000 μm or less, 100 μm to 1,000 μm, or 100 μm to 700 μm. More specifically, the glass substrate 21 may have a thickness of 100 μm to 500 μm. Although applying a thinner packaging substrate is advantageous in that electrical signal transmission can be made more efficient, but the packaging substrate also should serve as a supporting body of packaging, so it is preferable to apply the glass substrate 21 having the above thickness. Here, the thickness of the glass substrate refers to the thickness of the glass substrate itself, except for the thickness of the electrically conductive layer on the glass substrate.

The core via 231 may be formed by removing a predetermined region of the glass substrate 21. In one example, the core via 231 may be formed by etching a glass plate physically and/or chemically.

In detail, the core via 231 may be formed by forming a defect (flaw) on the surface of the glass substrate by means of a laser or the like and then applying chemical etching, laser etching, or the like, but the present disclosure is not limited thereto.

The core via 231 comprises a circular core via 231a, of which the opening part is substantially circular in shape, and a non-circular core via 231b, of which an aspect ratio in the x-y direction of the opening part is 1.2 or more.

The circular core via 231a refers to a general core via substantially having an aspect ratio of 1 in the x-y direction though it is indicated as circular, and is not limited to meaning an exact circle shape.

The non-circular core via 231b specifically comprises the shape of its opening part being oval-shape, quadrangle-shape, L-shape, or U-shape, and the shape is not specially limited. Accordingly, the non-circular core via may have a cross-section in a trapezoid or quadrangle shape.

The non-circular core via 231b has an opening part of which an aspect ratio in the x-y direction is above a certain degree. Additionally, one, two, or more electric power transmitting elements may be connected to the non-circular core via, and at least a part of the electric power transmitting elements (Ex. electrodes of one end) may be disposed to be electrically connected to the non-circular core via.

An electric power transmitting element like MLCC serves an important role in the performance of a semiconductor element. An electric power transmitting element, as a passive element, is generally applied in the number of at least 200 to a semiconductor element. The performance of the electric power transmitting element for transmitting electric power is also affected by the properties of an electrically conductive layer around the element. The embodiment applies a non-circular core via 231b to a place where an electrically conductive layer with low resistance like such an electric power transmitting element is required.

In a case of a conventional organic substrate, a method of forming core vias and connecting an upper part and a lower part of the substrate through the core vias, and thereby allowing electric current, which is connected to an electric power transmitting element, to be connected by penetrating the glass substrate, is applied. However, surface resistance affecting electric power transmission is a factor affected by the size of a cross-section of an electric conductive layer, and the size of a cross-section of an electrically conductive layer is limited to below the size of a cross-section area of a via. Accordingly, in order to increase the magnitude of electric current, it is required to increase the cross-section area of a core via, but when a conventional method of penetrating by a drill and the like is applied, increasing the cross-section area of a core via is not easy.

One or more embodiments may apply a non-circular oval via 231b with a large aspect ratio in the x-y direction and a comparatively large cross-section area, which is additional to the characteristics obtained by applying a glass substrate and described above. Such a non-circular oval via has the advantage of forming an electrically conductive layer inside the non-circular oval via to have the desired form, and sufficient volume is possible. Besides, in a case of a glass substrate, a chemical process of forming a via (e.g., chemical etching) unlike a physical process of forming a via is included, and thereby when a defect for forming a non-circular core via is formed in the process of generating a defect on a place where a via is formed before etching, a circular core via and a non-circular core via can be formed simultaneously even without a separate etching process to be added.

The non-circular core via 231b may have an opening part of which aspect ratio in the x-y direction may be 1.2 or more, 2 or more, or 3 or more. Also, the aspect ratio of an opening part in the x-y direction of the non-circular core via 231b may be 25 or less, 20 or less, or 15 or less. When an opening part of the non-circular core via is formed in such a range, the non-circular core via is more advantageous for disposing elements.

An electrically conductive layer with a minimum thickness of 5 μm or more may be disposed inside the non-circular core via 231b. In detail, a non-circular via distribution pattern 242 as an electrically conductive layer disposed inside the non-circular core via 231b may have a thickness of 10 μm or more, or 15 μm or more. The maximum thickness of the non-circular via distribution pattern 242 is a thickness when the internal of the non-circular core via is filled, and it depends on the size of a non-circle core via, thus the upper limit is not specified.

Inside the non-circular core via, an electrically conductive layer filling 30% or more of the inner volume of the non-circular core via may be disposed. That is, the volume of the non-circular via distribution pattern 242 may be 30% or more, 40% or more, or 50% or more, when the volume of the non-circular core via is designated as 100%. Also, the volume of the non-circular via distribution pattern 242 may be 60% or more, 70% or more, or 80% or more, when the volume of the non-circular core via is designated as 100%. Inside a non-circular core via where the non-circular via distribution pattern is not disposed, an insulating layer 223 (core insulating layer) may be disposed.

The non-circular via distribution pattern 242 may have various forms.

In detail, the non-circular via distribution pattern 242 may be formed in the form of a conformal-via pattern 242a, where an electrically conductive layer surrounds the inner diameter surface of the non-circular core via.

The non-circular via distribution pattern 242 may be formed in the form of a filled-via pattern where all the inner space of the non-circular core via is filled with an electrically conductive layer. In this time, the filled-via pattern may be a form 242b (filled-via pattern I) where all the inner space of the non-circular core via is filled with a filled-via, or may be a form 242c (filled-via pattern II) where a non-conformal-via pattern is once formed and after that the internal thereof is totally filled thereby composing a filled-via pattern.

The non-circular via distribution pattern 242 may be a composite-via pattern where some of the inner space of the non-circular core via is filled with an electrically conductive layer, and the remainder is filled with an insulating layer and the like. In detail, the non-circular via distribution pattern may be a form 242d (composite-via pattern I) where an electrically conductive layer is formed to substantially meet the inner diameter surface of the non-circular core via, and the remainder (center part) is filled with an insulating layer, or may be a form 242e (composite-via pattern II) where an insulating layer is formed to substantially meet the inner diameter surface of the non-circular core via, and an electrically conductive layer is formed in the space other than the insulating layer. Accordingly, a cross-section observed at a surface where the non-circular via distribution pattern is cut parallel to the first surface of the glass substrate may have a shape of an oval, a quadrangle, an oval ring, or the like.

Such a form and composition of the non-circular via distribution pattern may be regulated depending on the degree of desired electrical conductivity (the degree of surface resistance), and the performance, size, and number of an electric power transmitting element disposed on the non-circular via distribution pattern.

The electric power transmitting element 48 may be electrically connected to the non-circular via distribution pattern 242, passing through the non-circular core via 231b, and one, two, or more electric power transmitting elements per one non-circular core via may be electrically connected.

The electrical connection may be formed in a form that one side electrode 481 of the electric power transmitting element is disposed on the non-circular via distribution pattern 242. Or otherwise, the electrical connection may be applied with a method of connecting the non-circular via distribution pattern 242 and/or the electrode 481 of the electric power transmitting element by a separate distribution pattern.

The core via 231 comprises a first opening part 233 in contact with the first surface; a second opening part 234 in contact with the second surface; and a minimum inner diameter part 235 having the smallest inner diameter in the entire core via which connect the first opening part 233 and the second opening part 234.

A diameter CV1 of the first opening part may be substantially equal to or different from a diameter CV2 of the second opening part.

The minimum inner diameter part 235 may be disposed in the first opening part 233 or the second opening part 234. In this case, the core via 231 may be a cylindrical-type core via or a (truncated) triangular-pyramid-type core via. In this case, a diameter CV3 of the minimum inner diameter part 235 corresponds to the smaller one between the diameter of the first opening part 233 and the diameter of the second opening part 234.

The minimum inner diameter part 235 may be disposed between the first opening part 233 and the second opening part 234. In this case, the core via 231 may be a barrel-type core via. In this case, the diameter CV3 of the minimum inner diameter part 235 may be smaller than the larger one between the diameter of the first opening part 233 and the diameter of the second opening part 234.

The core distribution layer 24 comprises a core distribution pattern 241, which is electrically conductive layers for electrically connecting the first surface 213 and the second surface 214 of the glass substrate 21 through a through-via; and a core insulating layer 223 surrounding the core distribution pattern 241.

An electrically conductive layer may be formed inside the core layer 22 through a core via, and thus the core layer 22 may serve as an electrical passage penetrating the glass substrate 21. Also, the core layer 22 may connect upper and lower parts of the glass substrate 21 with a relatively short distance to have faster electrical signal transmission and lower loss properties.

The core distribution pattern 241 comprises patterns that electrically connect the first surface 213 and the second surface 214 of the glass substrate 21 through the core via 231. Specifically, the core distribution pattern 241 comprises a first surface distribution pattern 241a, which is an electrically conductive layer disposed on at least a part of the first surface 213, a second surface distribution pattern 241c, which is an electrically conductive layer disposed on at least a part of the second surface 214, and a core via distribution pattern 241b, which is an electrically conductive layer for electrically connecting the first surface distribution pattern 241a and the second surface distribution pattern 241c to each other through the core via 231. As the electrically conductive layer, for example, a copper plating layer may be applicable, but the present disclosure is not limited thereto.

The glass substrate 21 serves as an intermediate role or an intermediary role for connecting the semiconductor element unit 30 and the motherboard 10 to the upper and lower parts thereof, respectively, and the core via 231 serves as a passage for transmitting electrical signals thereof, thereby facilitating signal transmission.

The thickness of the electrically conductive layer measured at the larger one between the first opening part and the second opening part by diameter may be equal to or greater than the thickness of the electrically conductive layer formed at the minimum inner diameter part.

The core distribution layer 24 is electrically conductive layers formed on the glass substrate 21 and may satisfy that a cross-cut adhesion test value according to ASTM D3359 is 4B or greater, and specifically may satisfy that the cross-cut adhesion test value is 5B or greater. Also, the electrically conductive layers that are the core distribution layer 24 may have an adhesive strength of 3 N/cm or more and a bonding strength of 4.5 N/cm or more with respect to the glass substrate 21. When such a degree of bonding strength is satisfied, the bonding strength is sufficient for applying in a packaging substrate and is applied as a bonding strength between the substrate and the electrically conductive layer.

An upper layer 26 is disposed on the first surface 213.

The upper layer 26 may comprise an upper distribution layer 25, and an upper surface connection layer 27 disposed on the upper distribution layer 25, and the uppermost surface of the upper layer 26 may be protected by a cover layer 60 where an opening part, which is capable of being in direct contact with a connecting electrode of the semiconductor element unit, is formed.

The upper distribution layer 25 comprises an upper insulating layer 253 disposed on the first surface and an upper distribution pattern 251 that has a predetermined pattern and is built in the upper insulating layer 253 as an electrically conductive layer having at least a part electrically connected to the core distribution layer 24.

Any material applied to semiconductor elements or packaging substrate is applicable to the upper insulating layer 253, for example, an epoxy-based resin comprising a filler may be applied, but the present disclosure is not limited thereto.

The insulating layer may be formed by forming and hardening a coating layer, or by laminating an insulating film, which is filmed in a state of not being hardened or being semi-hardened, to a core layer and hardening the laminate. In this time, when a method of pressure-sensitive lamination and the like are applied, the insulator is embedded even in the space inside a core via, and thus efficient process proceeding can be made. Also, even though double-layered insulating layers are applied with being stacked, a substantial distinction between the layers may be difficult, so that a plurality of insulating layers are collectively referred to as an upper insulating layer. Also, the same insulating material may be applied to the core insulating layer 223 and the upper insulating layer 253. In this case, the boundary therebetween may not be substantially distinguished.

The upper distribution pattern 251 refers to electrically conductive layers disposed inside the upper insulating layer 253 in a predetermined form, and may be formed through a build-up layer procedure. In detail, the upper distribution pattern 251 in which electrically conductive layers are vertically or horizontally formed in a desired pattern may be formed by repeating a process of: forming an insulating layer; removing an undesirable part of the insulating layer, and then forming an electrically conductive layer through copper plating or the like; removing an undesirable part of the electrically conductive layer and then forming an insulating layer on this electrically conductive layer; and removing an undesirable part and then forming an electrically conductive layer through plating or the like.

Since the upper distribution pattern 251 is disposed between the core layer 22 and the semiconductor element unit 30, the upper distribution pattern 251 is formed to include a fine pattern at least partially, so that the transmission of electrical signals with the semiconductor element unit 30 may proceed smoothly and a desired complicated pattern may be sufficiently accommodated. In this case, the fine pattern may have a width and an interval of less than 4 µm, 3.5 µm or less, 3 µm or less, 2.5 µm or less, or 1 µm to 2.3 µm (hereinafter the description of the fine pattern is the same).

To form the upper distribution pattern 251 to comprise a fine pattern, at least two methods are applied in the embodiment.

One method is to apply a glass substrate 21 as the glass substrate of the packaging substrate. The glass substrate 21 can have a considerably flat surface property with a surface roughness (Ra) of 10 angstroms or less, thereby minimizing the influence of surface morphology of a supporting substrate on the formation of the fine pattern.

The other method is based on the property of the insulating layer. As the insulating layer, a filler component may be applicable in addition to resin, and inorganic particles such as silica particles may be applicable as the filler. When the inorganic particles are applied to the insulating layer as the filler, the size of the inorganic particles can affect whether to form the fine pattern. Therefore, particle fillers with an average diameter of 150 nm or less are applied as the insulating layer in the present disclosure, in detail, includes particle fillers with an average diameter of 1 nm to 100 nm. Such a characteristic can minimize the influence of the insulator itself on the formation of an electrically conductive layer with a width of a few micrometers while maintaining desirable properties of the insulator at a certain level or more, and can also help form a fine pattern with good adhesion onto the surface, due to the fine surface morphology.

The upper surface connection layer 27 comprises an upper surface connection pattern 272 and an upper surface connecting electrode 271. The upper surface connection pattern 272 is disposed at the upper insulating layer 253 and at least part of which is electrically connected to the upper distribution pattern 251. The upper surface connecting electrode 271 electrically connects the semiconductor element unit 30 and the upper surface connection pattern 272. The upper surface connection pattern 272 may be disposed on one surface of the upper insulating layer or may be embedded with the upper insulating layer 253, at least a part thereof being exposed on the upper insulating layer 253. For example, the upper insulating layer may be formed by a method of plating or the like when the upper surface connection pattern is disposed on one side of the upper insulating layer. Also, the upper insulating layer may be formed by a method of forming a copper plating layer or the like and then partially removing the insulating layer or the electrically conductive layer through surface polishing or surface etching and the like, when the upper surface connection pattern is embedded with the upper insulating layer 253, at least a part thereof being exposed on the upper insulating layer 253.

The upper surface connection pattern 272 may at least partially comprise a fine pattern like the above-described upper distribution pattern 251. The upper surface connection pattern 272, comprising a fine pattern like this, may enable a larger number of elements to be electrically connected to one another even in a narrow area to facilitate an electrical signal connection between or external of the elements to achieve a more integrated packaging.

The upper surface connecting electrode 271 may be connected to the semiconductor element unit 30 directly through a terminal and the like or via an element connection unit 51 such as a solder ball.

The packaging substrate 20 is also connected to the motherboard 10. The motherboard 10 may be directly connected to the second surface distribution pattern 241c, which is a core distribution layer disposed on at least a part of the second surface 214 of the core layer 22, through a motherboard terminal or may be electrically connected to the second surface distribution pattern 241c via a board connection unit such as a solder ball. Also, the second surface distribution pattern 241c may be connected to the motherboard 10 through the lower layer 29 disposed under the core layer 22.

The lower layer 29 comprises a lower distribution layer 291 and a lower surface connection layer 292.

The lower distribution layer 291 comprises i) a lower insulating layer 291b, at least a part of which is in contact with the second surface 214; and ii) a lower distribution pattern 291a embedded in the lower insulating layer 291b and having a predetermined pattern, and at least a part of which is electrically connected to the core distribution layer.

The lower surface connection layer 292 comprises i) a lower surface connecting electrode 292a electrically connected to the lower surface connection pattern and may further comprise ii) a lower surface connection pattern 292b, at least a part of which is electrically connected to the lower distribution pattern 291a and at least a part of which is exposed to one surface of the lower insulating layer 291b.

The lower surface connection pattern 292b, which is a part connected to the motherboard 10, may be formed as a non-fine pattern wider than the fine pattern, unlike the upper surface connection pattern 272, to efficiently transmit electrical signals.

One feature of the present disclosure is that substantially an additional substrate other than the glass substrate 21 is not applied to the packaging substrate 20 disposed between the semiconductor element unit 30 and the motherboard 10.

Conventionally, an interposer and an organic substrate were stacked between the element and the motherboard. It is considered that such a multi-stage form has been applied for at least two reasons. One reason is that there is a scale problem in directly bonding the fine pattern of the element to the motherboard, and the other reason is that wiring damage may occur due to a difference in thermal expansion coefficient during the bonding process or during the driving process of the semiconductor device. The embodiment has solved the problems by applying the glass substrate with a thermal expansion coefficient similar to that of the semiconductor element and by forming a fine pattern with a fine scale enough to mount the elements, on the first surface of the glass substrate and its upper layer.

It is possible to make the overall thickness of the semiconductor device 100 thinner by the semiconductor device 100 having a considerably thin packaging substrate 20, and it is also possible to dispose a desired electrical connection pattern even in a small area by applying the fine pattern. In detail, the packaging substrate 20 may have a thickness of 2000 µm or less, 1500 µm or less, or 900 µm. Also, the packaging substrate 20 may have a thickness of 120 µm or more or 150 µm or more. Due to the above-described characteristics, the packaging substrate can electrically and structurally connect the element and the motherboard stably even with a relatively thin thickness, thereby contributing to miniaturization of the semiconductor device in an aspect of surface area and thickness.

Figure 10:
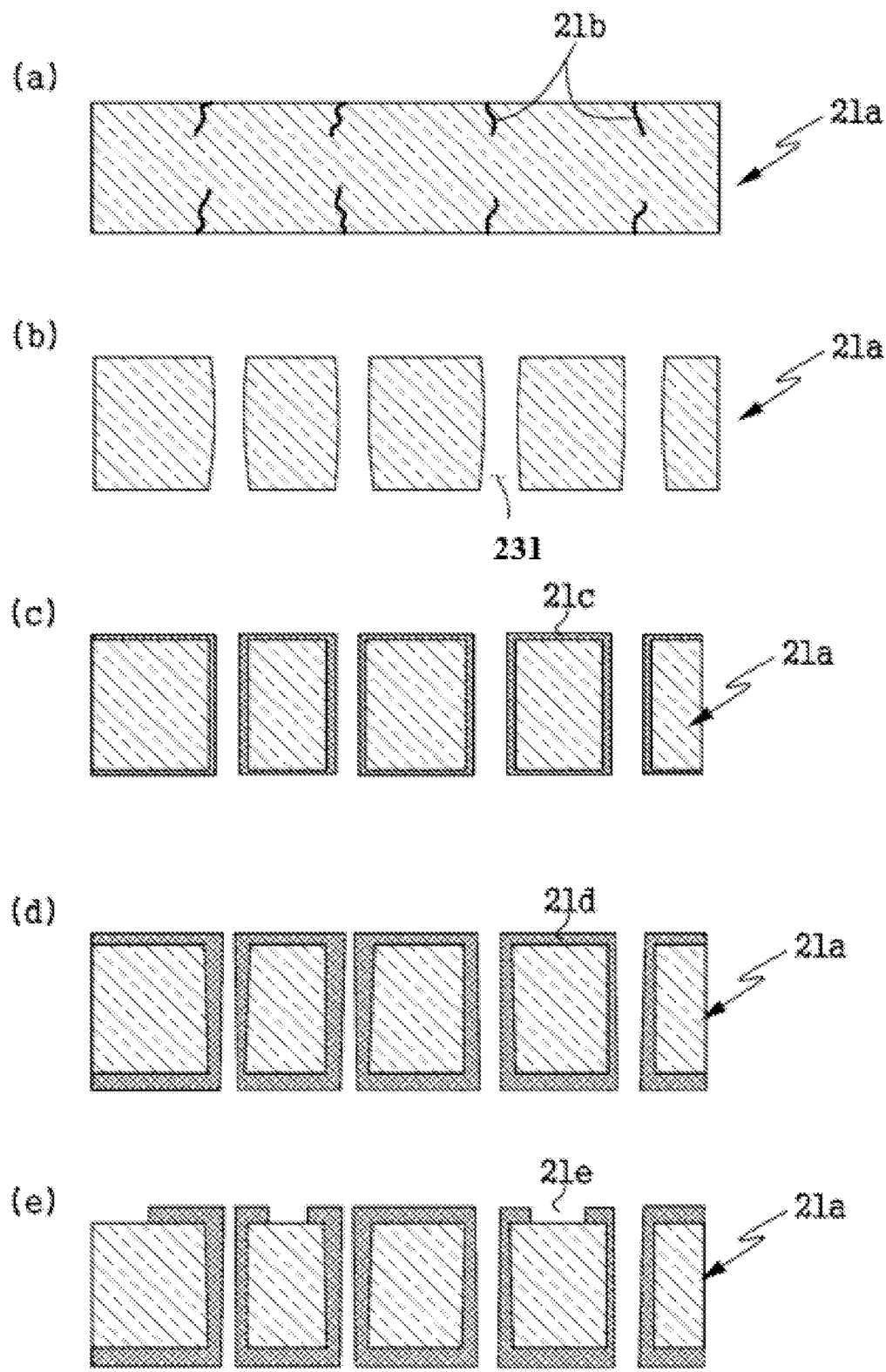
FIGS. 10 and 11 are flowcharts illustrating examples of a process of manufacturing a packaging substrate by using cross-sections of the examples.
Figure 11:
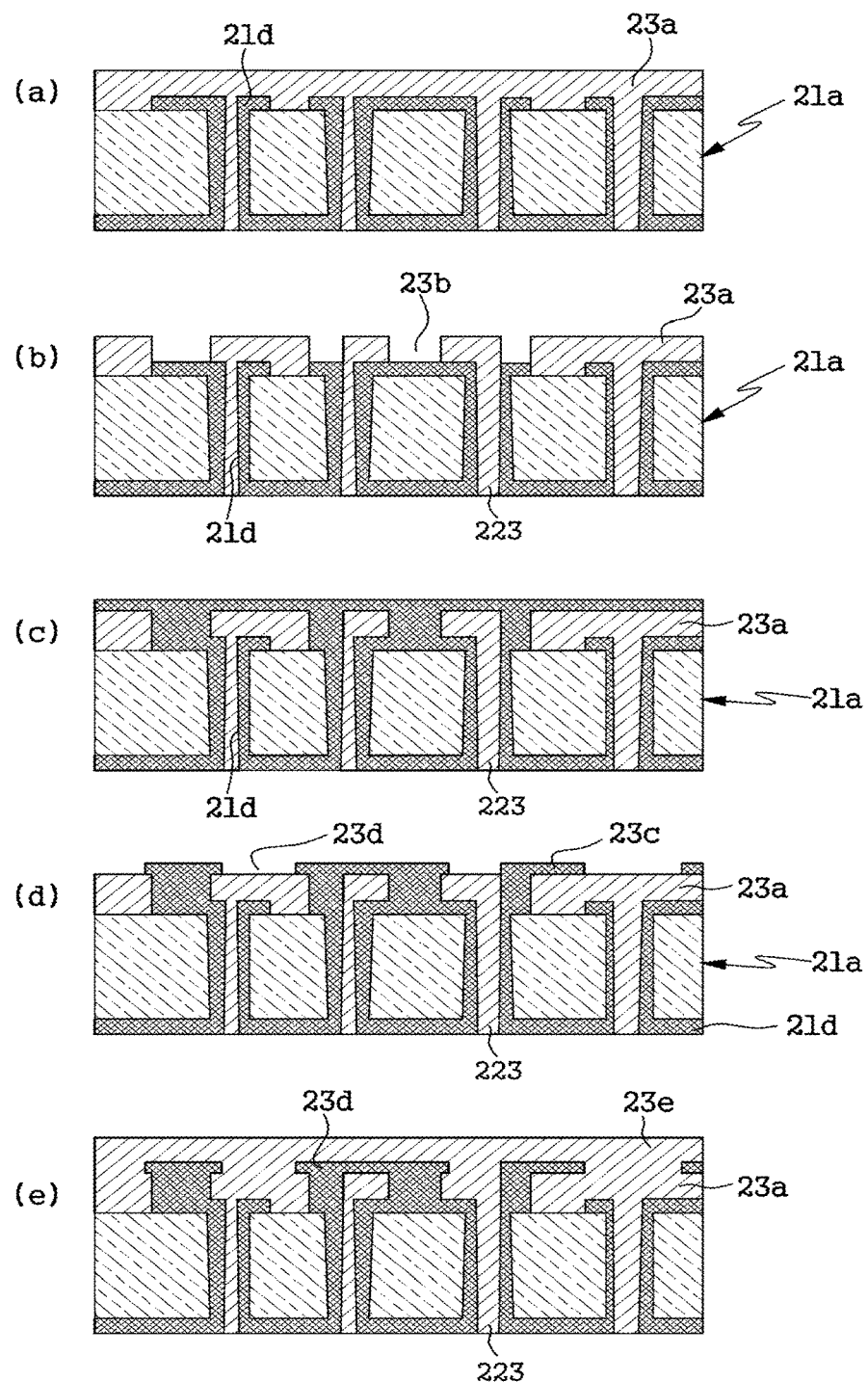

A method of manufacturing a packaging substrate according to another embodiment will be described below with reference to FIGS. 10 and 11.

A method of manufacturing a packaging substrate according to the embodiment comprises a preparation operation in which a defect is formed at predetermined positions of a first surface and a second surface of a glass substrate; an etching operation in which an etchant is applied to the glass substrate where the defect is formed to provide a glass substrate with a core via formed thereon; a core layer forming operation in which the surface of the glass substrate with the core via formed thereon is plated to form a core distribution layer, which is electrically conductive layers, thereby forming a core layer; and an upper layer forming operation in which an upper distribution layer, which is an electrically conductive layer surrounded by an insulating layer, is formed on one side of the core layer. In this time, a form of the defect comprises a circular defect for forming a circular core via and a non-circular defect overall formed along to the formation of a cross-section of a non-circular core via of for forming a non-circular core via. By these defects, a circular core via and a non-circular core via is formed at the same time, so that the method for forming core vias can have significantly excellent workability compared to a separate working with a drill for forming vias on an organic substrate.

The core layer forming operation may comprise a pre-treatment process in which an organic/inorganic composite primer layer comprising nanoparticles having amine groups is formed on the surface of the glass substrate having the core via formed thereon to prepare a pre-processed glass substrate; and a plating process in which a metal layer is plated on the pre-processed glass substrate.

The core layer forming operation may comprise a pre-treatment process in which a metal-containing primer layer is formed on the surface of the glass substrate having the core via formed thereon through sputtering to prepare a pre-processed glass substrate; and a plating process in which a metal layer is plated on the pre-processed glass substrate.

An insulating layer forming operation may be further comprised between the core layer forming operation and the upper layer forming operation.

The insulating layer forming operation may be an operation of positioning an insulating film on the core layer and performing pressure-sensitive lamination to form a core insulating layer.

The method of manufacturing the packaging substrate will be described in more detail.

1) Preparation Operation (Glass Defect Forming Process): A glass substrate 21a having flat first and second surfaces is prepared, and a defect (hole) 21b is formed at a predetermined position on the surface of the glass substrate, to form a core via. As the glass substrate, a glass substrate applied to a substrate of an electronic device or the like may be applicable. For example, a non-alkali glass substrate may be applicable, but the present disclosure is not limited thereto. As commercially available products, products manufactured by manufacturers such as Corning Inc., Schott AG, and AGC Inc. may be applicable. To form the defect (hole), mechanical etching, laser irradiation, or the like may be applicable.

2) Etching Operation (Core Via Forming Operation): The glass substrate 21a having the defect 21b (hole) formed thereon forms a core via through a physical or chemical etching process. During the etching process, the glass substrate may form a via at the defective part, and the surface of the glass substrate may be etched simultaneously. A masking film may be applied to prevent the surface of the glass substrate from being etched, but the glass substrate itself with the defect may be etched in consideration of any inconvenience caused by the process of applying and removing the masking film. In this case, the glass substrate having the core via may be somewhat thinner than the initial glass substrate.

3-1) Core Layer Forming Operation: An electrically conductive layer 21d is formed on the glass substrate. As a representative example of the electrically conductive layer, a metal layer containing copper metal may be applicable, but the present disclosure is not limited thereto.

The surface of the glass (comprising the surface of the glass substrate and the surface of the core via) and the surface of copper metal have different characteristics and thus are less adhesive. In the embodiment, the adhesion between the glass surface and the metal is improved by two methods, i.e., a dry method and a wet method.

The dry method is a method applying sputtering, that is, a method of forming a seed layer 21c on the inner diameter surface of the core via and on the glass surface through metal sputtering. During the formation of the seed layer, other metals such as titanium, chromium, and nickel may be sputtered together with copper or the like. In this case, it is considered that glass-metal adhesion is improved by the anchor effect in which the surface morphology of the glass and the metal particles interact with each other.

The wet method is a method applying primer treatment, that is, a method of forming a primer layer 21c by performing pre-treatment with a compound having a functional group such as amine. Depending on the desired degree of adhesion, after pre-treatment with a silane coupling agent, the primer treatment may be performed with a compound or particle having an amine functional group. As described above, it is desirable for the supporting substrate of the embodiment to have a high performance enough to form a fine pattern, and the high performance should be maintained even after the primer treatment. Accordingly, when such a primer contains nanoparticles, it is preferable that nanoparticles having an average diameter of 150 nm or less are applied. For example, it is preferable that nanoparticles are applied as particles having amine groups. The primer layer may be formed by applying, for example, a bonding-improving agent manufactured in CZ series by MEC Inc.

In the seed layer/primer layer 21c, an electrically conductive layer, i.e., a metal layer, may be selectively formed with or without removing a part where the formation of the electrically conductive layer is undesirable. Also, in the seed layer/primer layer 21c, a subsequent process may be performed after a part where the formation of the electrically conductive layer is desirable, or a part where the formation of the electrically conductive layer is undesirable is selectively processed such that the part becomes activated or deactivated for metal plating. For example, light irradiation treatment such as laser light of a certain wavelength, chemical treatment, or the like may be applied for the processing for activation or deactivation. A copper plating method or the like applied for manufacturing a semiconductor element may be applied to form the metal layer, but the present disclosure is not limited thereto.

During the metal plating, the thickness of the electrically conductive layer may be regulated by regulating several variables such as the concentration of a plating solution, a plating time, and the type of additive applied.

When a part of the core distribution layer is undesirable, the part may be removed. An etching layer 21e of the core distribution layer may be formed by forming an electrically conductive layer in a predetermined pattern by performing metal plating after partially removing or deactivating the seed layer.

3-2) Insulating Layer Forming Operation: An insulating layer forming operation may be performed in which an empty space of a core via is filled with an insulating layer after the core distribution layer, which is the electrically conductive layers, is formed. In this case, the insulating layer as a film type may be applied. For example, the film-type insulating layer may be applied through pressure-sensitive lamination. When pressure-sensitive lamination is performed in this manner, an insulating layer can be sufficiently embedded even in the empty space inside the core via thereby a core insulating layer without void occurrence can be formed.

4) Upper Layer Forming Operation: An upper distribution layer comprising an upper insulating layer and an upper distribution pattern is formed on the core layer. The upper insulating layer may be formed by coating a resin composition forming an insulating layer 23a or stacking an insulating film. Simply, the stacking of the insulating film is preferable. The stacking of the insulating film may be performed by laminating and hardening the insulating film. In this case, when pressure-sensitive lamination is applied, an insulating resin may be sufficiently embedded even into layers where the electrically conductive layer is not formed inside the core via. The upper insulating layer is at least partially in direct contact with the glass substrate, and thus provides sufficient adhesion. In detail, the glass substrate and the upper insulating layer may have an adhesion test value of 4 dB or more as according to ASTM D3359.

The upper distribution pattern may be formed by repeating a process of forming the insulating layer 23a, forming an electrically conductive layer 23c in a predetermined pattern, and etching an undesirable part to form an etching layer 23d of the electrically conductive layer. Electrically conductive layers formed adjacent to the insulating layer interposed therebetween may be formed by forming a blind via 23b on the insulating layer and then performing a plating process. A dry etching method such as laser etching and plasma etching, and the like, a wet etching method using a masking layer and an etching solution, and the like may be applied to form the blind via.

5) Upper Surface Connection Layer and Cover Layer Forming Operation: An upper surface connection pattern and an upper surface connecting electrode may be formed similarly to the formation of the upper distribution layer. In detail, the upper surface connection pattern and the upper surface connecting electrode may be formed by forming an etching layer 23f of an insulating layer on the insulating layer 23e, forming an electrically conductive layer 23g, and then forming an etching layer 23h of the electrically conductive layer. However, a method of selectively forming only the electrically conductive layer may be applied without the etching. A cover layer may be formed to have an opening part (not shown) at a position corresponding to the upper surface connecting electrode such that the upper surface connecting electrode is exposed and directly connected to an element connection unit, a terminal of an element, or the like.

6) Lower Surface Connection Layer and Cover Layer Forming Operation: A lower distribution layer and/or a lower surface connection layer, and optionally a cover layer (not shown) may be formed similarly to the above-described formation of the upper surface connection layer and the cover layer.

A packaging substrate and a semiconductor device comprising the same according to one or more embodiments can significantly improve electrical properties such as a signal transmission rate by connecting the semiconductor element and a motherboard to be closer to each other so that electrical signals are transmitted through as short a path as possible. Also, since the glass substrate applied as a core of substrate is an insulator itself, there is a lower possibility of generating a parasitic element effect on the device compared to a device with a conventional silicon core. Thus, it is possible to further simplify the process of insulating layer treatment, and it may be applied to a high-speed circuit. In addition, unlike silicon being manufactured in the form of a round wafer shape, the glass substrate is manufactured in the form of a large panel, and thus mass production is relatively easy, and economic efficiency can be further improved.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A packaging substrate comprising:
  a core layer comprising a glass substrate with a first surface and a second surface facing each other; and
  core vias respectively formed in the glass substrate and passing through the glass substrate in a thickness direction,
  wherein the core vias comprise circular core vias each having a circular opening part and non-circular core vias each having an aspect ratio of 1.2 or more in a x-y direction of an opening part,
  wherein one or more electric power transmitting elements are disposed on each non-circular core via,
  wherein an upper layer is disposed on the first surface,
  wherein the upper layer comprises an upper distribution layer,
  wherein the upper distribution layer comprises an upper insulating layer disposed on the first surface and an upper distribution pattern built in the upper insulating layer,
  wherein particle fillers with an average diameter of 150 nm or less are applied as the upper insulating layer,
  wherein an inner diameter surface of the core vias comprises a seed layer, and
  wherein the seed layer comprises copper and metals other than copper.

2. The packaging substrate of claim 1, further comprising an electrically conductive layer with a minimum thickness of 5 μm or more being disposed inside each non-circular core via.

3. The packaging substrate of claim 1, further comprising an electrically conductive layer occupying 30% or more of an inner volume of each non-circular core via being disposed inside each non-circular core via.

4. The packaging substrate of claim 1, wherein each non-circular core via has an oval, rectangular, L-shaped, or U-shaped opening.

5. The packaging substrate of claim 1, further comprising:
a non-circular via distribution pattern disposed inside each non-circular core via,
wherein the non-circular via distribution pattern comprises:
a filled-via pattern where all of an inner space of each non-circular core via is filled with an electrically conductive layer, and
a composite-via pattern where some of the inner space of each non-circular core via is filled with the electrically conductive layer and the remainder is filled with an insulating layer.

6. The packaging substrate of claim 5, wherein the filled-via pattern comprises:
a first filled-via pattern where all the inner space of each non-circular core via is filled with the electrically conductive layer, and
a second filled-via pattern where each non-circular core via comprises conformal-via pattern and all the inner space of each non-circular core via is filled with the electrically conductive layer.

7. The packaging substrate of claim 5, wherein the composite-via pattern comprises:
a first composite-via pattern where the electrically conductive layer is formed to substantially meet an inner diameter surface of each non-circular core via and the remainder inside each non-circular core via is filled with an insulating layer, and
a second composite-via pattern where an insulating layer is formed to substantially meet the inner diameter surface of each non-circular core via and the electrically conductive layer is formed in a space other than the insulating layer.

8. The packaging substrate of claim 5, wherein the electrically conductive layer of the non-circular via distribution pattern and an electrode of an electric power transmitting element are connected.

9. The packaging substrate of claim 1, wherein each of the core vias comprises:
a first opening part in contact with the first surface;
a second opening part in contact with the second surface; and
a minimum inner diameter part having a smallest inner diameter and connecting the first opening part and the second opening part.

10. A semiconductor device, comprising:
a semiconductor element unit comprising one or more semiconductor elements;
a packaging substrate electrically connected to the semiconductor element unit; and
a motherboard electrically connected to the packaging substrate,
wherein the packaging substrate comprises:
a core layer comprising a glass substrate with a first surface and a second surface facing each other; and
core vias respectively formed in the glass substrate and passing through the glass substrate in a thickness direction,
wherein the core vias comprise circular core vias each having a circular opening part and non-circular core vias each having an aspect ratio of 1.2 or more in a x-y direction of an opening part,
wherein one or more electric power transmitting elements are disposed on each non-circular core via,
wherein an upper layer is disposed on the first surface,
wherein the upper layer comprises an upper distribution layer,
wherein the upper distribution layer comprises an upper insulating layer disposed on the first surface and an upper distribution pattern built in the upper insulating layer,
wherein particle fillers with an average diameter of 150 nm or less are applied as the upper insulating layer,
wherein an inner diameter surface of the core vias comprises a seed layer, and
wherein the seed layer comprises copper and metals other than copper.

* * * * *